United States Patent
Luo et al.

(10) Patent No.: US 7,214,629 B1
(45) Date of Patent: May 8, 2007

(54) STRAIN-SILICON CMOS WITH DUAL-STRESSED FILM

(75) Inventors: Yuhao Luo, San Jose, CA (US); Deepak Kumar Nayak, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 174 days.

(21) Appl. No.: 10/989,673

(22) Filed: Nov. 16, 2004

(51) Int. Cl.
*H01L 21/8238* (2006.01)
(52) U.S. Cl. ............... 438/778; 438/514; 438/694; 438/761; 438/942; 257/635; 257/638
(58) Field of Classification Search ............... 438/514, 438/694, 695, 761, 778, 942, FOR. 388; 257/632, 635, 638
See application file for complete search history.

(56) References Cited

U.S. PATENT DOCUMENTS 5,562,770 A * 10/1996 Chen et al. ............... 438/202
6,573,172 B1 * 6/2003 En et al. ............... 438/626
2004/0104405 A1 6/2004 Huang et al.

* cited by examiner

*Primary Examiner*—George R. Fourson
*Assistant Examiner*—Joannie Adelle Garcia
(74) *Attorney, Agent, or Firm*—Scott Hewett; Justin Liu

(57) ABSTRACT

A semiconductor device has an NMOS portion and a PMOS portion. A first stress layer overlies a first channel to provide a first stress type to the channel and a first modified stress layer is formed from a portion of the first stress layer overlying a second channel. A second stress layer providing a second stress type overlies the first modified stress layer and a second modified stress layer is formed from a portion of the second stress layer overlying the first stress layer.

27 Claims, 4 Drawing Sheets

STRAIN-SILICON CMOS WITH DUAL-STRESSED FILM

FIELD OF THE INVENTION

The present invention relates generally to semiconductor devices and semiconductor device fabrication, and more specifically to complimentary metal-oxide-semiconductor ("CMOS") devices and methods of manufacture.

BACKGROUND OF THE INVENTION

CMOS devices are used in many types of applications, such as microprocessors, field-programmable gate arrays ("FPGAs"), complex logic devices ("CPLDs"), and application-specific integrated circuits ("ASICs"). A CMOS device basically has a pair of metal-oxide semiconductor field-effect transistors ("MOSFETs"), one being an n-type transistor, and the other being a p-type transistor, typically separated from each other by an isolation structure, such as an oxide-filled trench or doped guard-band region.

Many integrated circuits ("ICs") are fabricated in silicon. It is known that changing the lattice spacing of silicon by mechanical stress can increase the mobility of charge carriers (holes and electrons) in the silicon, and thus increase the speed and current-carrying ability of a MOSFET. In a CMOS cell (i.e. a CMOS device having an n-type MOSFET ("NMOS") paired with a p-type MOSFET ("PMOS")), performance of the NMOS half-cell is enhanced by applying tensile stress to the channel region, and performance of the PMOS half-cell is enhanced by applying compressive stress to the channel region.

Several techniques have been developed for applying the desired types of stresses to the appropriate halves of a CMOS cell. One technique uses strained silicon films on silicon-germanium buffer layers. However, this is a relatively complex and challenging technique. Another technique introduces strain into MOS devices by localized stress from a silicide cap layer, cap layer, or shallow-trench isolation layers. One approached uses a tensile-stressed silicon nitride etch stop layer to improve performance of the NMOS channel, as well as using a silicon-germanium source/drain to introduce compressive stress into the PMOS channel. However, the process of silicon-germanium source/drain PMOS fabrication typically uses selective epitaxial growth of silicon-germanium and other process steps that increase the cost and complexity of the fabrication process.

Therefore, techniques for applying different types of mechanical stress to each half of a CMOS device is desirable, and is further desirable to be able to incorporate such techniques into standard CMOS fabrication processes.

SUMMARY OF THE INVENTION

A semiconductor device has an NMOS portion and a PMOS portion. A first stress layer overlies a first channel to provide a first stress type to the channel and a first modified stress layer is formed from a portion of the first stress layer overlying a second channel. A second stress layer providing a second stress type overlies the first modified stress layer and a second modified stress layer is formed from a portion of the second stress layer overlying the first stress layer.

DETAILED DESCRIPTION OF THE DRAWINGS

Figure 1:
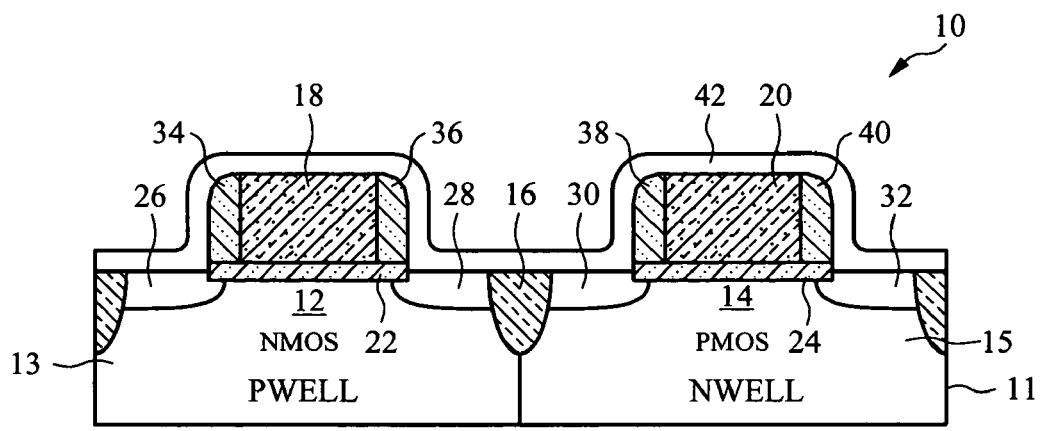
FIG. 1 is a simplified cross section of a CMOS cell suitable for processing into embodiments of the present invention.

FIG. 1 is a simplified cross section of a CMOS cell 10 suitable for processing into embodiments of the present invention. The CMOS cell 10 has an NMOS channel 12 forming a first conductive region and a PMOS channel 14 forming a second conductive region, separated by an isolation structure 16, such as an oxide-filled trench. The NMOS area of the CMOS device 10 is a portion of the CMOS device wherein the charge carriers are predominately electrons and the PMOS area is a portion wherein the charge carriers are predominately holes. The NMOS channel 12 is formed in a P-well 13 and the PMOS channel 14 is formed in an N-well 15. Voltage signals applied at gates 18, 20 formed over gate dielectric layers 22, 24 control current flow between electrodes (e.g. gates and drains) 26, 28, 30, 32. The NMOS channel 12 and the PMOS channel 14 are formed in a wafer, also commonly referred to as a substrate, 11, such as a silicon wafer, an epitaxial layer of silicon on a silicon wafer or an epitaxial layer of germanium or gallium-arsenide on a silicon wafer or other substrate, for example. Alternatively, other devices, such as bipolar devices, have conductive regions, such as base regions.

The gate dielectric layers are typically about 6 Angstroms to about 100 Angstroms thick. The NMOS channel 12 and the PMOS channel 14 are typically about 0.01 microns to about 10.0 microns long, and the PMOS and NMOS devices are typically designed to operate at a drain-source voltage between about 0.6 volts and about 3.3 volts. However, these values are merely exemplary, and do not limit embodiments of the invention.

In a particular embodiment, the gates 18, 20 are formed from polysilicon. Spacers 34, 36, 38, 40 on each side of the gates 18, 20 are a dielectric material, such as silicon nitride, silicon dioxide, or silicon oxy-nitride. A first (tensile) stress layer 42 is deposited over the CMOS cell 10. The first stress layer 42 is a layer of silicon nitride ($Si_3N_4$, $SiN$, or $Si_xN_y$), silicon oxynitride, titanium nitride, or silicon carbide, for example; however, other types of tensile layers are used in alternative embodiments.

In a particular embodiment, a tensile layer is a layer of silicon nitride between about 100 Angstroms and about 2000 Angstroms thick. An example of a process for forming a tensile-stress layer is provided in U.S. Patent Application Publication No. US 2004/0104405 A1, which is hereby incorporated by reference for all purposes. In some embodiments, the first stress layer 42 is used as an etch-stop layer.

Figure 2:
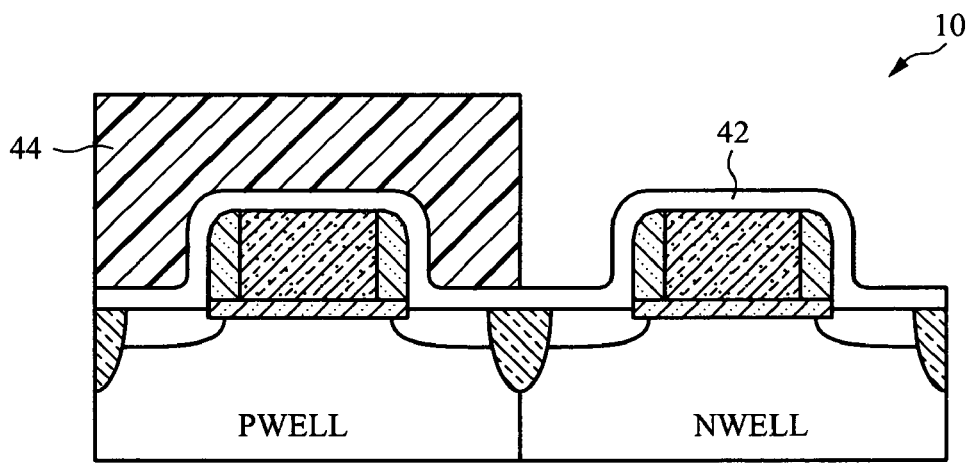
FIG. 2 shows the CMOS cell of FIG. 1 with a first layer of patterned photoresist covering the tensile layer over the NMOS area of the CMOS cell.

FIG. 2 shows the CMOS cell 10 of FIG. 1 with a first layer of patterned photoresist 44 covering a portion of the first stress layer 42, which is over the NMOS area of the CMOS cell 10. The photoresist is applied using conventional techniques. An N-well mask (not shown) is used to define which areas of the photoresist will remain on the CMOS device, and which areas of the photoresist will be removed from the CMOS device, i.e., the N-well mask is used to pattern the photoresist. An N-well mask is the mask used to define the areas of a semiconductor wafer that will be doped to create "wells" of n-type semiconductor in the wafer, as is well known in the art of CMOS fabrication.

Figure 3A:
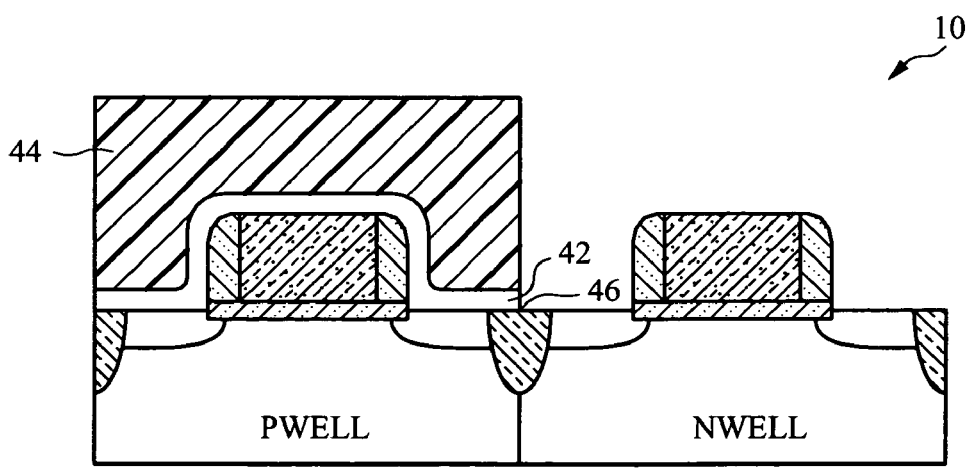
FIG. 3A is cross section of an embodiment of the invention wherein the tensile layer of FIG. 2 has been removed from the PMOS area of the CMOS cell.

FIG. 3A is cross section of an embodiment of the invention wherein the first stress layer 42 of FIG. 2 has been removed (etched) from the PMOS area of the CMOS cell 10. The photoresist 44 is patterned by the N-well mask, and the photoresist 44 protects the first stress layer 42 over the NMOS area of the CMOS cell 10 from being etched. Using the N-well mask to pattern the photoresist at this step is desirable and has the advantage of avoiding having to fabricate a separate mask for patterning the first stress layer 42. However, using the N-well mask for this step can also result in artifacts (e.g. a "fence" or a "trench") at the edge 46 of the N-well masked region that can arise from slight misalignment of the photomask and photolithography process. In embodiments where a thick inter-layer dielectric layer, which is often chemically-mechanically polished after deposition, is formed over such artifacts, they do not interfere with the performance of the CMOS device or with subsequent fabrication operations. N-well techniques are used in a variety of ICs, including EPROMs, microprocessors, and dynamic RAMs.

Using an N-well mask is desirable for at least two reasons. First, the N-well mask is a mask that has already been created for use in another part of the fabrication process, and hence defining the stress layers with such a mask does not require producing a separate mask. A mask used in another part of the fabrication process, other than just defining the stress layers, will be referred to as a "fabrication mask" for purposes of this patent application. In other words, a fabrication mask is used to pattern the photoresist that masks selected portions of the stress layer(s), and is also used in another part of the fabrication sequence of the integrated circuit. A fabrication mask can be used with one type of photoresist (e.g. negative photoresist) in one part of the fabrication sequence, and another type of photoresist (e.g. positive photoresist) when defining the patterned stress layer(s).

Second, the N-well mask masks the entire N-well portion of the CMOS cell. Thus, the resulting stress layers cover the entire N-well portion, and the corresponding stress layers entirely cover the remaining portion of the CMOS cell. Having stress layers that extend across the entire N-well portion of the device provides more stored energy than a corresponding layer that does not extend across the entire N-well portion.

Figure 3B:
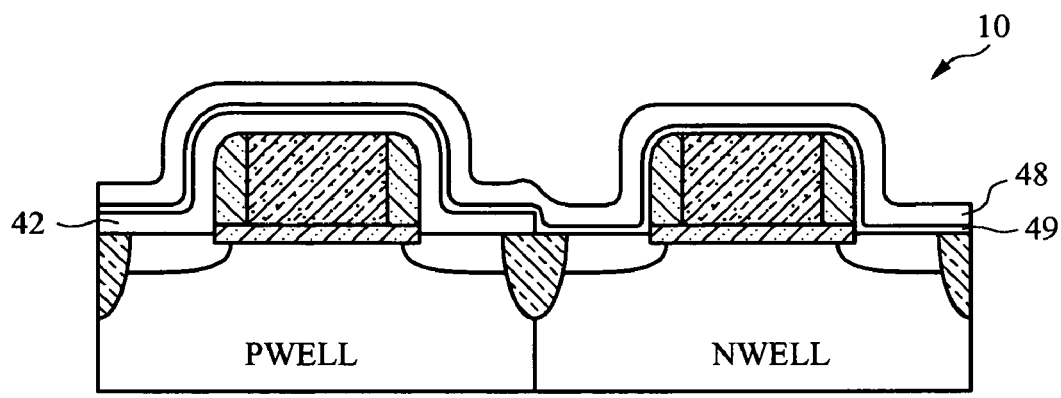
FIG. 3B is a cross-section of the embodiment of FIG. 3A wherein a compressive layer is formed over the CMOS device.

FIG. 3B is a cross-section of the embodiment of FIG. 3A wherein a second (compressive) stress layer 48 is formed over the CMOS device 10. An optional etch-stop layer 49 is formed on the CMOS device 10 before the second stress layer 48 is formed. An etch-stop layer 49 is desirable when using etch techniques that etch both the second stress layer 48 and the first stress layer 42. Alternatively, a timed etch is used and the etch-stop layer is not necessary. In yet alternative embodiments, the second stress layer etches much faster than the first stress layer, and an etch-stop layer is not required. The compressive layer is silicon nitride ($Si_3N_4$, or SiN or $Si_xN_y$), silicon oxy-nitride, silicon oxide, or silicon dioxide, for example. In one embodiment, the compressive layer is formed from a different material than the tensile layer. Alternatively, the compressive layer is formed from nominally the same material as the tensile layer, but is formed under different conditions, such as different pressure, temperature, and gas flows. An example of a process for forming a compressive-stress layer is provided in U.S. Patent Application Publication No. US 2004/0104405 A1, previously incorporated by reference.

Figure 3C:
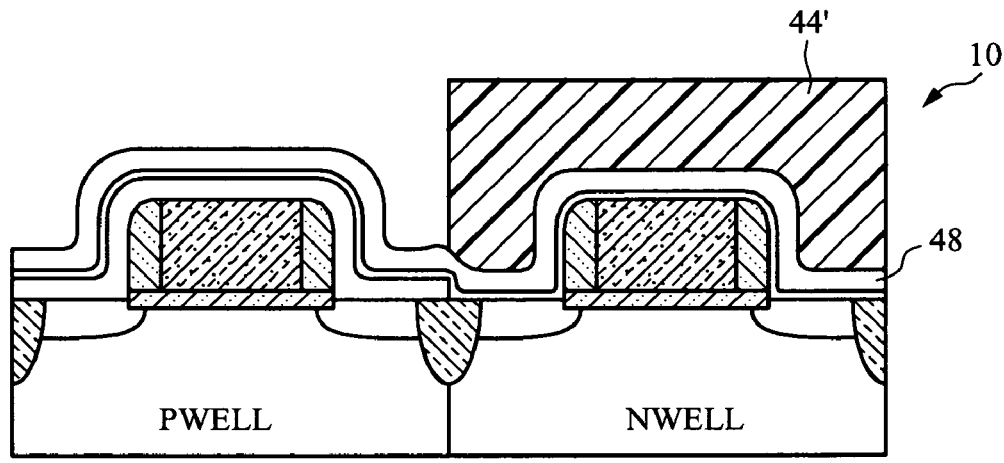
FIG. 3C is a cross section of the embodiment of FIG. 3B with a second layer of patterned photoresist on the portion of the compressive layer over the PMOS area of the CMOS cell.

FIG. 3C is a cross section of the embodiment of FIG. 3B with a second layer of patterned photoresist 44' on the portion of the second stress layer 48 over the PMOS area of the CMOS cell 10. The photoresist 44' was patterned with the N-well mask using the opposite type of photoresist used in FIG. 3A (e.g. the photoresist in FIG. 3A is negative photoresist and the photoresist in FIG. 3C is positive photoresist). Alternatively, a negative of the N-well mask (which is often referred to as a P-well mask) is used with the same type of photoresist.

Figure 3D:
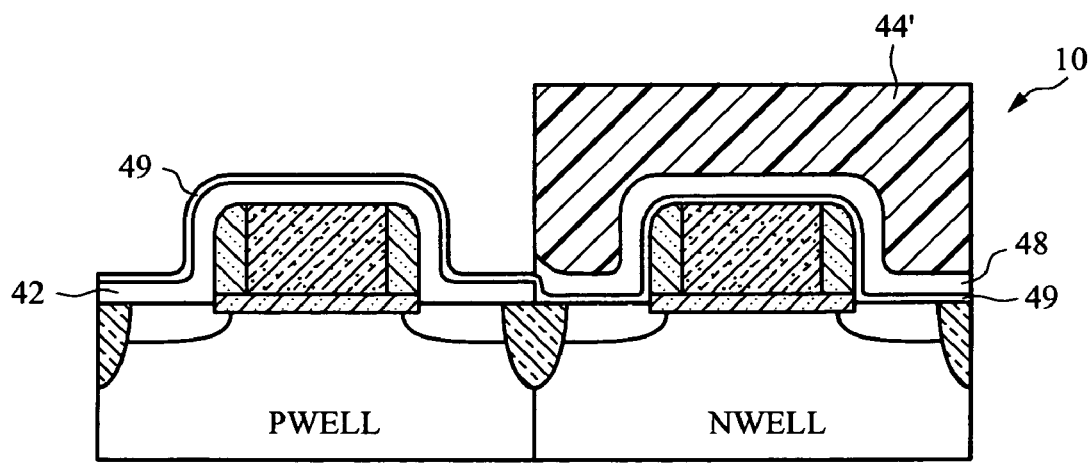
FIG. 3D is a cross section of the embodiment of FIG. 3C with the compressive layer removed from the NMOS area of the CMOS device.

FIG. 3D is a cross section of the embodiment of FIG. 3C with the second stress layer 48 removed from the NMOS area of the CMOS device 10. Thus, the first stress layer 42 lies over the NMOS area, and the second stress layer 48 lies over the PMOS area. The optional etch-stop layer 49 is optionally removed from the NMOS area, or left on the CMOS device, as shown. The patterned photoresist 44' is subsequently removed (not shown) to provide a CMOS device with a compressive layer over the PMOS area and a tensile layer patterned by the N-well mask over the NMOS area. The edges of stress layer regions adjoin. Essentially the entire CMOS device is covered with one or the other type of stress layer. A relatively thick ILD layer (see FIG. 4C, ref. num. 50) is formed over the CMOS device, covering artifacts (e.g. fences and trenches) formed at the edge between the PMOS and NMOS areas that might arise because the edges of the stress layers abut one another.

Figure 4A:
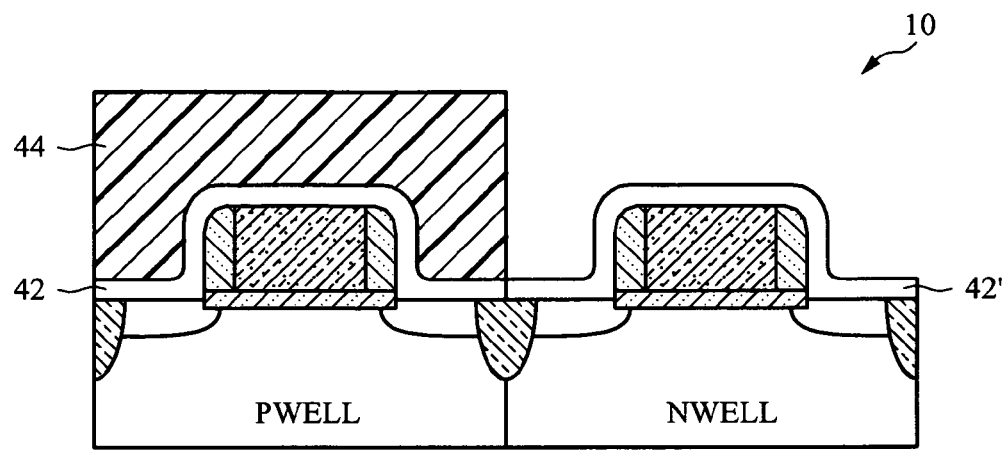
FIG. 4A is the CMOS device of FIG. 2 in accordance with another embodiment of the present invention.

FIG. 4A is the CMOS device 10 of FIG. 2 in accordance with another embodiment of the present invention. Tensile stress in the exposed portion of the first (tensile) stress layer 42 is relaxed by ion implantation, such as implanting Ge ions to produce a first modified stress layer 42'. For example, a fluence of Ge ions between about $1 \times 10^{14}/cm^2$ and about $10 \times 10^{14}/cm^2$ are implanted at energy(s) of between about 10 KeV and about 200 KeV. Alternatively, other ions are used to modify the stress in the layer, such as argon ions. The ion implantation reduces the tensile stress in the layer. The patterned photoresist 44 serves as the ion-implantation mask.

Figure 4B:
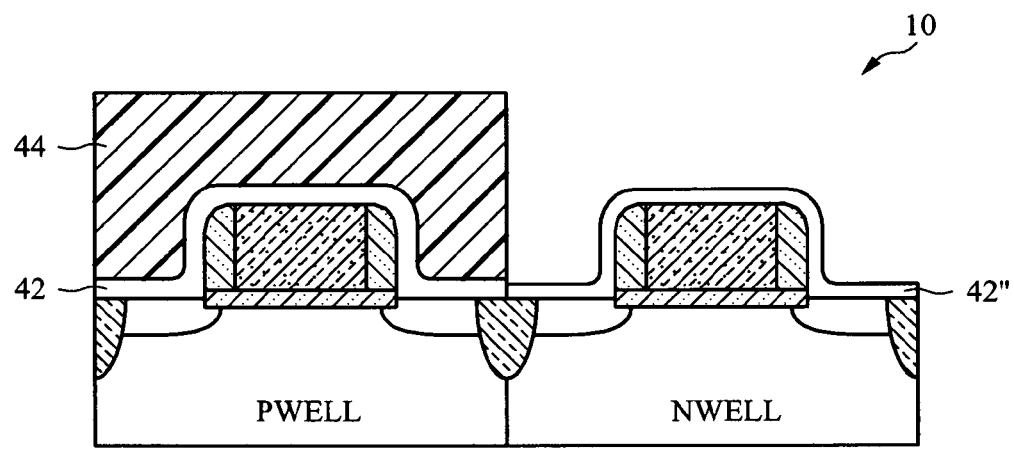
FIG. 4B is the CMOS device of FIG. 4A wherein a portion of the relaxed layer has been etched away to form a thinned relaxed layer.

FIG. 4B is the CMOS device 10 of FIG. 4A wherein a portion of the first modified stress layer has been etched away to form a thinned first modified stress layer 42". Thinning further reduces the stress in the first modified stress layer. The patterned photoresist 44 serves as the etch mask. Alternatively, the first stress layer 42 is thinned before the portion of the first stress layer over the PMOS area is ion-implanted, i.e. the steps illustrated in FIGS. 4A and 4B are reversed. In another embodiment, the tensile stress in the portion of the first stress layer over the PMOS area is reduced by ion implantation, and is not thinned. In yet another embodiment, the stress in the portion of the first stress layer over the PMOS area is reduced by thinning, and is not ion-implanted to further reduce the tensile stress. In other embodiments, stress in the modified stress layer is increased.

In a particular embodiment, the thinned first modified stress layer is approximately one-half the thickness of the first stress layer 42. The thinned first modified stress layer 42" has little, if any, residual stress (i.e. it is a "neutral-stress" layer). Alternatively, a neutral stress layer is formed only by ion implantation or only by thinning and additional processing, such as rapid thermal annealing that modifies the stress in the thinner layer more that the stress in the thicker layer. After thinning and/or ion-implanting to form the first modified stress layer 42", the photoresist 44 is removed (stripped).

Figure 4C:
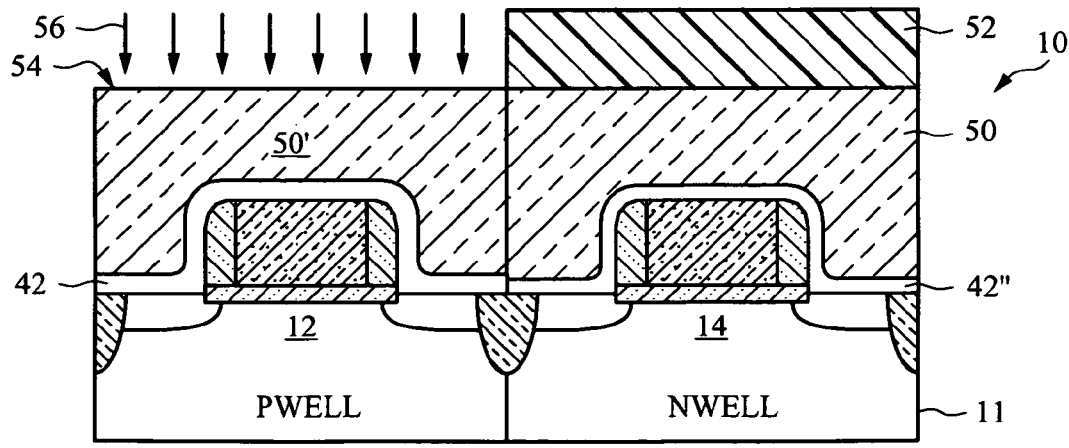
FIG. 4C is the CMOS device of FIG. 4B with a compressive ILD layer covering the CMOS device, including the neutral-stress layer.

FIG. 4C is the CMOS device 10 of FIG. 4B with a second (compressive) stress layer 50, which is an ILD layer, covering the CMOS device 10, including the modified stress layer 42". The second stress layer has the opposite type of stress than the first stress layer. A layer of patterned photoresist 52 covers the portion of the second stress layer 50 over the PMOS area of the CMOS device 10. Techniques for forming compressive ILD layers are known in the art. The upper surface 52 of the second stress layer 50 is chemically-mechanically polished to provide a flat, smooth surface 54 for defining subsequent structures and features, such as metal traces, on the wafer 11. ILD layers are layers that are typically relatively thick, such as between about 1,000 Angstroms to about 10,000 Angstroms.

The patterned photoresist 52 masks the portion of the second stress layer 50 over the PMOS area of the CMOS device 10 from ion implantation (represented by arrows 56) that modifies the compressive stress in the portion of the second stress layer 50 over the NMOS area to form a second (relaxed) modified stress layer 50'. In this embodiment, the ion implantation reduces the compressive stress. The photoresist is removed after ion implantation.

Both the NMOS area and the PMOS area have two stress layers that cooperate to provide the desired stress to the respective portions of the CMOS device 10. The NMOS area has the first (tensile) stress layer 42 and the second modified stress layer 50' providing a tensile stress to the NMOS channel 12, and the PMOS area has the has the first modified stress layer 42" and the second stress layer 50 providing a compressive stress to the PMOS channel 14. In a particular embodiment, the tensile layer 42 over the NMOS portion of the CMOS device 10 is an etch-stop layer, and the first modified stress layer 42" over the PMOS portion of the CMOS device 10 is also an etch-stop layer.

Figure 5:
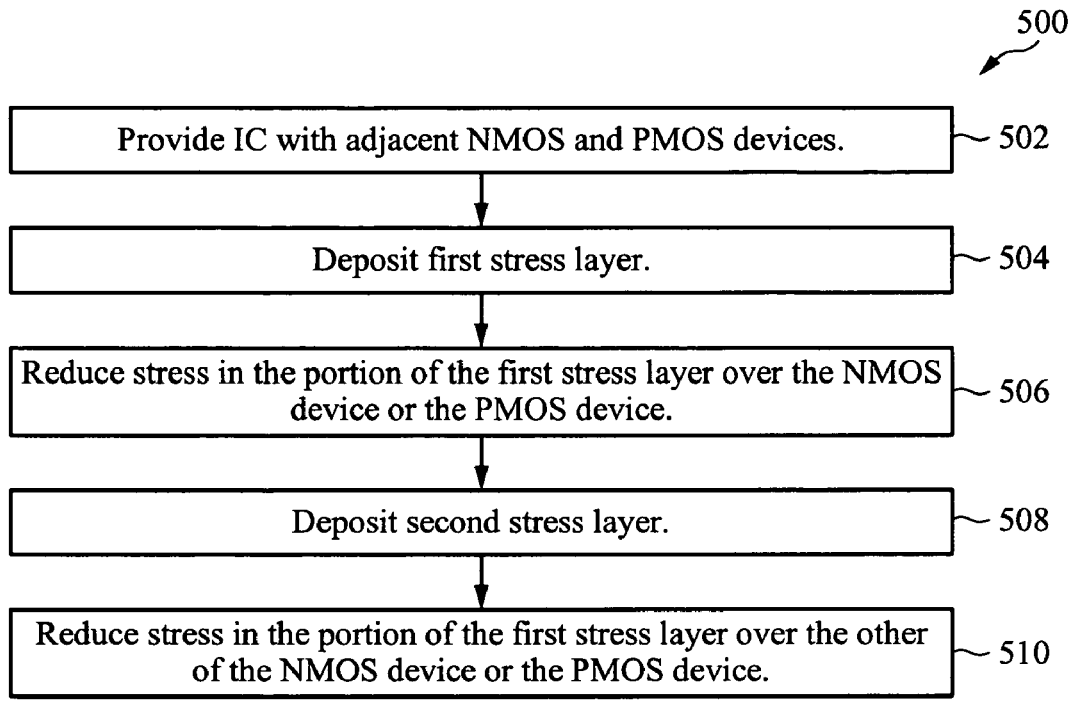
FIG. 5 is a flow chart of a method 500 of improving the mobility of charge carriers in an integrated circuit.

FIG. 5 is a flow chart of a method 500 of improving the mobility of charge carriers in an integrated circuit. An integrated circuit having an NMOS device adjacent to a PMOS device is provided (step 502). The NMOS device has a first conductive region, such as a first channel, wherein current is carried primarily by a first type of charge carrier, such as electrons, having a first mobility in the first conductive region when the NMOS device is in operation. The PMOS device has a second conductive region, such as a second channel, wherein current is carried primarily by a second type of charge carrier, such as holes, having a second mobility the second conductive region when the PMOS device is in operation.

A first stress layer having a first stress type (i.e. compressive or tensile) is formed over the NMOS device and over the PMOS device (step 504). Stress is modified (e.g. reduced) in the first stress layer over one of the NMOS device and the PMOS device to form a first modified stress layer, such as be ion implantation and/or thinning (step 506). A second stress layer having a second stress type is formed over the first stress layer and over the first modified stress layer (step 508). Stress is reduced in the second stress layer over the other of the NMOS device and the PMOS device to form a second modified stress layer (step 510).

In other words, both the NMOS device and the PMOS device have stress applied to the active regions of the device by a stress layer in combination with a modified stress layer, which increases the mobility of the charge carriers in the active regions of the NMOS and PMOS devices.

In the embodiment illustrated in FIGS. 4A–4C, the first stress layer is a tensile layer and the first modified stress layer is a first relaxed stress layer formed over the PMOS portion of the CMOS device. In an alternative embodiment, the first stress layer is a compressive layer and the first modified stress layer is formed over the NMOS portion of the device. The ILD layer is a tensile layer, and the stress in the portion of the ILD layer overlying the PMOS portion of the device is reduced to form the second modified stress layer.

Figure 6:
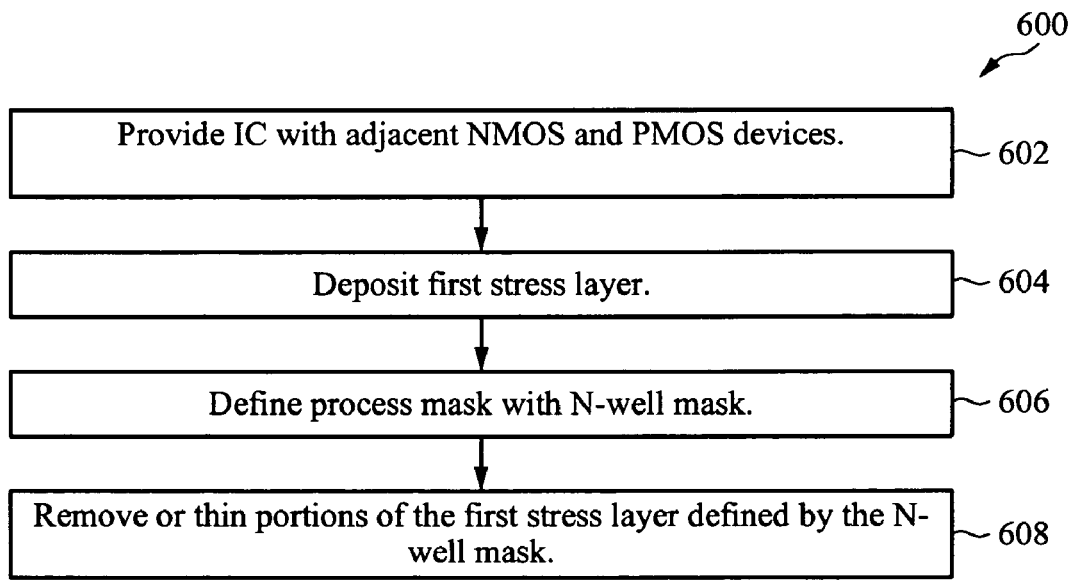
FIG. 6 is a flow chart of a method of improving the mobility of charge carriers in an integrated circuit according to another embodiment of the present invention.

FIG. 6 is a flow chart of a method 600 of improving the mobility of charge carriers in an integrated circuit according to another embodiment of the present invention. An integrated circuit having an NMOS device adjacent to a PMOS device is provided (step 602). A first stress layer having a first stress type (i.e. compressive or tensile) is formed over the NMOS device and over the PMOS device (step 604). An N-well photomask is used to photolithographicly define a processing mask (e.g. a layer of patterned photoresist) over one of the NMOS portion of the CMOS device and the PMOS portion of the CMOS device (step 606). At least a portion of the first stress layer is removed according to processing mask defined by the N-well mask (608). For example, in one embodiment the first stress layer is removed from one portion of the CMOS device and a second stress layer is deposited, as illustrated in FIGS. 3A–D. In another embodiment, the first stress layer is thinned from one portion of the CMOS device and a second stress layer is deposited, as illustrated in FIGS. 4A–4C.

While the present invention has been described in connection with specific embodiments, variations of these embodiments will be obvious to those of ordinary skill in the art. For example, it is not necessary that adjoining p-type and n-type devices form a CMOS cell. Similarly, dual stress layers are useful to modify carrier in other types of devices, such as bipolar devices. Therefore, the spirit and scope of the appended claims should not be limited to the foregoing description.

The invention claimed is:

1. A semiconductor device comprising:
   a first portion having a first conductive region wherein current is carried by a first type of charge carrier;
   a second portion having a second conductive region wherein current is carried by a second type of charge carrier;
   a first stress layer overlying the first conductive region providing a first stress type;
   a third stress layer formed by modifying a portion of the first stress layer overlying the second conductive region;

a second stress layer providing a second stress type overlying the third stress layer; and a fourth stress layer formed by modifying a portion of the second stress layer overlying the first stress layer;

wherein the first stress layer and the fourth stress layer enhance a first mobility of the first type of charge carriers in the first channel and the third stress layer and the second stress layer enhance a second mobility of the second type of charge carriers in the second channel.

2. The semiconductor device of claim 1 wherein the third stress layer is a first reduced stress layer.

3. The semiconductor device of claim 2 wherein the fourth stress layer is a second reduced stress layer.

4. The semiconductor device of claim 1 wherein the first conductive region is a first channel and the second conductive region is a second channel.

5. The semiconductor device of claim 1 wherein the first stress layer is an etch-stop layer.

6. The semiconductor device of claim 1 wherein the second stress layer is an inter-layer dielectric layer.

7. The semiconductor device of claim 6 wherein the fourth stress layer is comprises a relaxed layer formed by ion implantation.

8. The semiconductor device of claim 1 wherein the third stress layer comprises a relaxed layer formed by ion implantation.

9. The semiconductor device of claim 1 wherein the third stress layer comprises a thinned layer.

10. The semiconductor device of claim 1 wherein the third stress layer comprises a neutral-stress layer.

11. The semiconductor device of claim 1 wherein the third stress layer is defined by a fabrication mask.

12. The semiconductor device of claim 11 wherein the fabrication mask is an N-well mask.

13. The semiconductor device of claim 1 wherein the first stress layer adjoins the third stress layer.

14. The semiconductor device of claim 1 wherein the semiconductor device is a complimentary metal-oxide semiconductor ("CMOS") device.

15. The CMOS device of claim 14 wherein the CMOS device is incorporated in a programmable logic device.

16. A method of improving mobility of charge carriers in an integrated circuit comprising:

providing an integrated circuit having an n-type metal-oxide-semiconductor ("NMOS") device adjacent to a p-type metal-oxide-semiconductor ("PMOS") device;

forming a first stress layer having a first stress type over the NMOS device and over the PMOS device;

modifying stress in the first stress layer over one of the NMOS device and the PMOS device to form a first modified stress layer;

forming a second stress layer having a second stress type over the first stress layer and the first modified stress layer; and modifying stress in the second stress layer over the other of the NMOS device and the PMOS device to form a second modified stress layer;

wherein the step of modifying the stress in the first stress layer includes ion implantation into a selected portion of the first stress layer.

17. The method of claim 16 wherein the selected portion is defined by an N-well mask of the NMOS device.

18. The method of claim 16 wherein the second modified stress layer is formed by ion implantation into a selected portion of the second stress layer.

19. The method of claim 16 wherein the second stress layer is an inter-layer dielectric layer.

20. The method of claim 16 wherein the first stress layer is an etch-stop layer.

21. A method of improving mobility of charge carriers in an integrated circuit comprising:

providing an integrated circuit having an n-type metal-oxide-semiconductor ("NMOS") device adjacent to a p-type metal-oxide-semiconductor ("PMOS") device;

forming a first stress layer having a first stress type over the NMOS device and over the PMOS device;

modifying stress in the first stress layer over one of the NMOS device and the PMOS device to form a first modified stress layer;

forming a second stress layer having a second stress type over the first stress layer and the first modified stress layer; and modifying stress in the second stress layer over the other of the NMOS device and the PMOS device to form a second modified stress layer;

wherein the step of modifying the stress in the first stress layer includes thinning a selected portion of the first stress layer.

22. The method of claim 21 wherein the selected portion is defined by an N-well mask of the NMOS device.

23. The method of claim 21 wherein the step of modifying the stress in the first stress layer further includes ion implantation into the selected portion of the first stress layer.

24. The method of claim 23 wherein the selected portion is defined by an N-well mask of the NMOS device.

25. The method of claim 21 wherein the second modified stress layer is formed by ion implantation into a selected portion of the second stress layer.

26. The method of claim 21 wherein the second stress layer is an inter-layer dielectric layer.

27. The method of claim 21 wherein the first stress layer is an etch-stop layer.

* * * * *